THIN FLEXIBLE THERMOELECTRIC DEVICE

Filed Oct. 16, 1967 2 Sheets-Sheet 1

INVENTOR
ROBERT OTTO OSBORN

BY Claude T. Beaudoin
ATTORNEY

INVENTOR
ROBERT OTTO OSBORN
BY Claude L. Beaudoin
ATTORNEY

United States Patent Office 3,554,815
Patented Jan. 12, 1971

3,554,815
THIN, FLEXIBLE THERMOELECTRIC DEVICE
Robert Otto Osborn, Snyder, N.Y., assignor to E. I. du Pont de Nemours and Company, Wilmington, Del., a corporation of Delaware
Continuation-in-part of application Ser. No. 276,815, Apr. 30, 1963. This application Oct. 16, 1967, Ser. No. 675,640
Int. Cl. H01v 1/02, 1/04
U.S. Cl. 136—203 4 Claims

ABSTRACT OF THE DISCLOSURE

A thermoelectric device is provided such as, for example, a thermopile consisting of a base support of a thin, flexible film of polyethylene terephthalate having noncontacting bands of antimony and bismuth each disposed on the opposite surface thereof in conductive electrical association.

The present application is a continuation-in-part of copending application Ser. No. 276,815 filed on Apr. 30, 1963, and now abandoned.

The present invention relates to thermoelectric devices and, more particularly, is directed to compact multijunction thermoelectric structures having thin layers of electrically conductive materials of unlike thermoelectric power deposited on opposite surfaces of a non-conductive film support of thin, flexible organic thermoplastic polymeric material.

Thermoelectric devices of the present invention in which thermoelectric elements are disposed as surface coatings of thin, flexible electrically non-conductive film or web supports of organic thermoplastic polymeric material are characterized by many desirable advantages including noise-free and maintenance-free operation and a great latitude in choice of size, weight, shape and capacity for special uses. These devices possess many advantages over welded wire structures having relatively massive modular elements such as rods or bars or those in which the thermoelectric materials are deposited on insulating fibers or strips.

According to the present invention there is provided a thermoelectric device adapted for connection to a utilization circuit comprising a non-conductive support of a thin, flexible film structure of organic thermoplastic polymeric material having electrically conductive material of unlike thermoelectric power disposed on each surface thereof in the form of a plurality of non-contacting bands or thin layers arranged in conductive electrical association.

The present invention embraces a thermopile having unlike thermoelectric materials deposited on each surface of a flexible, electrically non-conductive base of organic thermoplastic polymeric material wherein the ratio of the thickness of the thermoelectric materials to the thickness of the flexible base is between about 5:1 and about 0.3:1. A specific thermopile configuration comprises an electrically nonconductive flexible film base of polyethylene terephthalate having electrically conductive material of different thermoelectric power on each surface thereof in the form of non-contacting bands of equal width each in conductive electrical association, wherein the flexible film base is adapted to be rolled along its major axis to provide a thermopile of cylindrical construction having thermocouple junctions adjacent the ends of the cylindrical structure thereof.

The nature and advantages of the present invention will be more clearly understood by the following description and the several views illustrated in the accompanying drawings wherein like reference characters refer to the same parts throughout the several views and in which.

Figure 1:
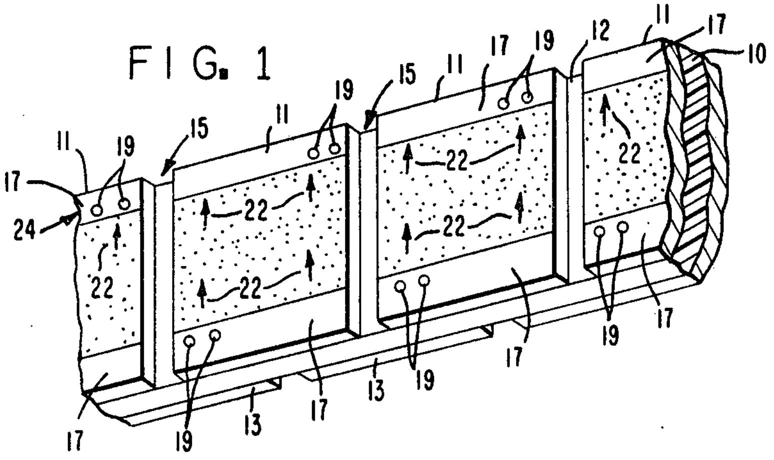
FIG. 1 is a view in perspective of a portion of a thermoelectric device.
Figure 2:
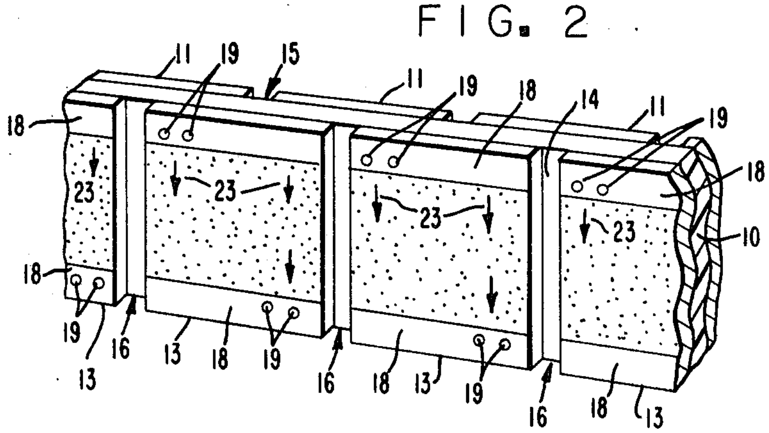
FIG. 2 is a perspective view of the back-side of the device of FIG. 1.
Figure 3:
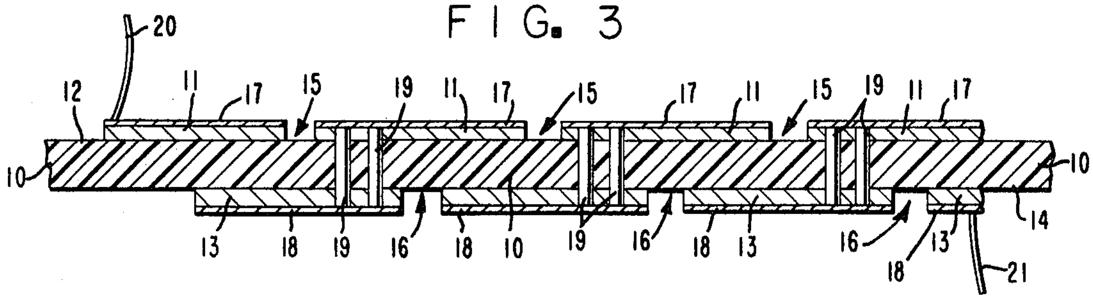
FIG. 3 is a cross-sectional view in the longitudinal direction of the device of FIG. 2.

The thermoelectric device herein disclosed in illustration of the invention includes a flexible, electrically nonconductive base or support of organic thermoplastic polymeric material in film form having electrically conductive material of unlike thermoelectric power disposed on each surface thereof. Referring to FIGS. 1, 2 and 3, a thin base or support 10 of a flexible film of organic thermoplastic polymeric material is provided with noncontacting bands 11 of electrically conductive material on surface 12 thereof. Similar bands 13 of electrically conductive material of unlike thermoelectric power than bands 11 are provided on surface 14 of flexible film base 10. Bands 11 may be of antimony and bands 13 may be of bismuth but each also may be of semi-conductive materials such as bismuth telluride compositions appropriately doped to provide maximum thermal efficiency. Each band of electrically conductive thermoelectric material on each surface of film base 10 is separated from the bands thereof that are immediately adjacent thereto. That is, bands 11 are disposed on surface 12 of film base 10 to provide separations 15 therebetween, and bands 13 are disposed on surface 14 of film base 10 to provide separations 16 therebetween.

The bands 11 and 13 of unlike electrically conductive thermoelectric material are electrically conductively connected by means of conductive strips 17 on bands 11 and conductive strips 18 on bands 13 that are interconnected by connectors 19. The conductive strips 17 and 18 should be of a material of greater electrical conductivity, such as silver, aluminum, or nickel, than the thermoelectric material in order to provide a low resistance path. The connectors 19 are provided by perforating the film base 10 at the desired locations and filling the perforations with a metal, conductive paint, lacquer or cement, so as to provide an electrically conductive path through the laminar structure, as is shown more clearly in FIG. 3. Vapor deposited aluminum or conductive silver paint can be used.

The film base or support is electrically non-conductive and is of thin organic thermoplastic polymeric material having a softening point above the temperature at which the hot junction of the thermoelectric device operates. Such films include, for example, polyesters, polyolefins, polyimides and vinyls. For cooling applications there is quite a wide variety of films satisfactory as a support, since the temperature of the hot junction can be limited by dissipation of accumulated heat to a heat sink or heat transfer medium. For power generation applications, where it is highly desirable to utilize high temperature energy sources in order to operate at high efficiencies, the temperature of the hot junction is preferably higher than can be withstood by many of the more common organic polymers from which self-supporting films are generally made. Accordingly, it is highly desirable to use a film base or support of a heat-resistant polymer, such as the polyimides as may be derived from pyromellitic acid.

The thermoelectric device of FIG. 1 having bands 11 and 13 of unlike thermoelectric materials on each surface of flexible film support 10 is coated with a thin coating of electrical insulating lacquer to protect the metal coating from mechanical damage and to provide electrical insulation between successive surfaces of electrically conducting thermoelectric materials. Such insulators will include SiO, $SiO_2$, collodion, colloidal alumina, or the well-known insulating lacquers such as the acrylic lacquers.

It has been found, in order to obtain a full effective and efficient thermopile, that the ratio of the thickness of the electrically conductive thermoelectric materials on the film base or support to the thickness of film base must be between about 5:1 and about 0.3:1, and that the film thickness may range from about 0.10 mil to about 2.0 mil. Thus, the thickness of the electrically conductive thermoelectric materials may range from about 0.03 mil to about 2.0 mils. Thinner film supports can be used thereby to avoid the tendency towards fracture of the thicker layers of thermoelectric materials to maintain the ratio or the thickness of the thermoelectric material to the thickness of the film substrate within the perscribed range.

Even with the stability of biaxially oriented polyethylene terephthalate film, devices with film thickness of under 0.1 ml (0.0001 inch) and a thickness of bismuth and antimony greater than 0.5 mil (e.g. 0.6 mil) are unreliable and frequently crack upon bending, rolling or folding. Similarly, coatings of these metals on 0.15 mil thick films in which the metals have thicknesses greater than 1.0 mil crack frequently and are unreliable. Since these metals are about as malleable as any of the commonly employed thermoelectric materials, the upper limit of the ratio of the thickness of the thermoelectric material to the thickness of the film support is in the order of 5:1. Devices constructed outside these limits are operable but inefficient.

The thermoelectric device of FIG. 1 may be provided with electrical connectors or wires 20 and 21 such as shown in FIG. 3 at the respective ends of the device to provide means for connecting the thermoelectric device to an external utilization circuit, which may be a source of DC power if the thermoelectric device is to be used for cooling (or heating) or to an electric power consuming or storage device if it is to be used for power generation or thermal measurements. More specifically, when the current flowing through the device as shown in FIGS. 1–3 passes from a p-type thermoelectric material to an n-type thermoelectric material, the junction will be cooled, in accordance with the Peltier effect, and, conversely, the junction will be heated when current flow passes from n-type to p-type thermoelectric material. The effect of cooling or heating may be reversed by merely reversing the direction of flow of current through the device. The device likewise can be used as a source of electric current by establishing a temperature gradient between the two parallel edges thereof in accordance with the Seebeck effect. For instance, the path of electric current flow may be in the direction indicated by arrow 22 on band 11 and arrow 23 on band 13 as shown in FIGS. 1 and 2. In the construction of the thermoelectric device depicted in FIGS. 1–3, the bands of thermoelectric material 11 and 13 are disposed on opposite surfaces 12 and 14 of film support 10 to provide an overlapping relationship. Film support 10 should not extend beyond the edges of the electrically conductive thermoelectric materials, but should prevent electrical shorting between opposite surfaces. In operation, electrical current may enter conductor strip 17 as indicated by arrow 24 in FIG. 1, and then pass through connector 19 to conductive strip 18 on band 13 of thermoelectric material indicated in FIG. 2. The current then passes through the thermoelectric material in the direction indicated by arrows 23 to conductive strip 18 and then through connectors 19 to the next adjacent band of thermoelectric material 11.

Figure 4:
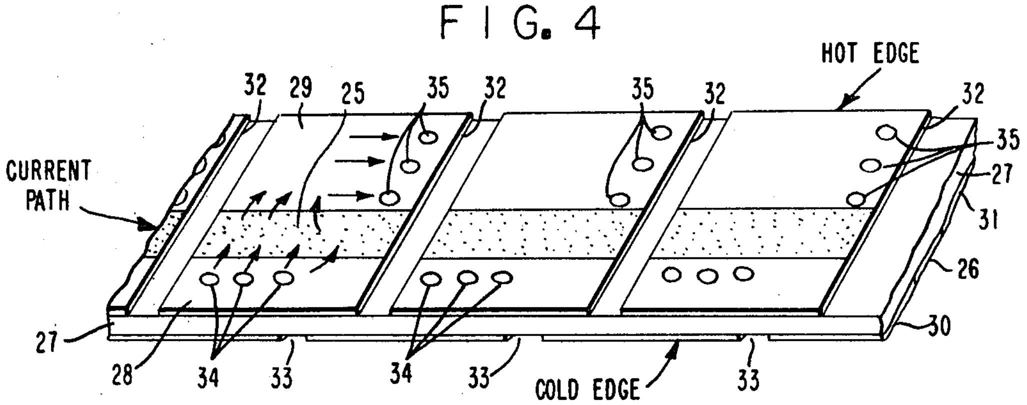
FIG. 4 is a perspective view of another embodiment of a thermoelectric device having thermoelectric material on both surfaces thereof.

A preferred structure of a thermoelectric device according to the present invention is illustrated in FIG. 4. This embodiment is similar to that shown in FIGS. 1–3 but having different positioning of thermoelectric materials and conductive strips and connectors which provide a minimum of resistance heating in the cold area of the thermoelectric device especially desirable when it is employed for cooling and refrigeration.

As illustrated in FIG. 4, interrupted bands 25 and 26 of thermoelectric material are disposed longitudinally on opposite surfaces of film support 27. Conductive strips 28 and 29 adjacent bands 25 and conductive strips 30 and 31 adjacent bands 26 are disposed on film support 27 to provide an overlapping relationship of the transverse edges 32 and 33 thereof.

The conductive strips 28, 29 and 30, 31 extend in the longitudinal direction only as far as the adjacent area of thermoelectric material. The electrically conductive strips provide a pathway of low electrical resistance between the edge of the thermoelectric material and the edge of the support, and are disposed to make electrical contact with the thermoelectric material on a line parallel to the major or long axis of the film support and the connector means to conduct the electric current through the film support.

The connector means 34 and 35 are provided on conductive strips 28 and 29, respectively, each adjacent thermoelectric strip 25, and the connector means are disposed orthogonally to each other to provide for a minimum electrical resistance on the cold edge of the thermopile. This is accomplished by positioning connector means 34 in alignment on the cold junction side adjacent and parallel to the edge of the thermoelectric material, while connector means 35 are positioned along a line substantially parallel to and intermediate transverse edges 32 and 33. This latter arrangement permits engagement by connector means 35 of the overlapping portions of the thermoelectric materials on opposite surfaces of the film support to provide coupling of the thermoelectric materials in series electrical connection.

Figure 5:
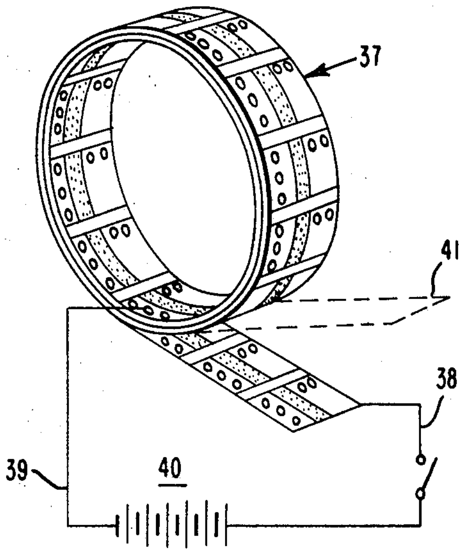
FIG. 5 is a perspective view of the device of FIG. 4 in roll or convolute form.

In practice the thermopile is preferably used in the form of a convolute coil, as shown in FIG. 5. The end thermoelectric coatings of coil 37 are coupled by wires 38 and 39, respectively, to a source of direct current shown schematically as a battery 40. In winding the coil, shown in FIG. 5, it is essential to provide electrical insulation between the successive convolutions. A convenient method is to apply a coating of insulating lacquer to at least one surface of the strip thermopile after completion of the fabrication but before winding. Illustrated in FIG. 5 is the interwinding of a thin insulating film 41, such as polyethylene terephthalate, although a thin coating of an insulating material or lacquer is preferred.

Figure 6:
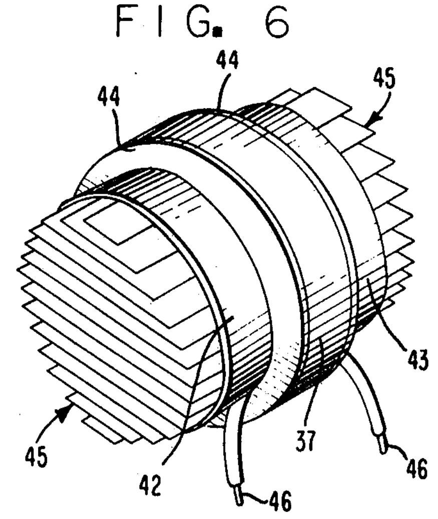
FIG. 6 is a perspective view illustrating schematically a heat exchanger embodying the thermoelectric device of FIG. 5.

FIG. 6 illustrates a module constructed according to this invention, employing a convolute coil form of thermoelectric device as illustrated in FIG. 5. Coil 37 is fitted with heat exchanger 42 and 43 which are of a good thermal conductor, such as aluminum or copper, and have flanges 44 contacting the hot and cold edges of coil 37. Fins 45 are provided on each end of the structure to facilitate heat transfer. Heat exchangers 42 and 43 are of hollow construction, with the interior enclosed by them filled with an insulating material to reduce heat transfer between the hot and cold ends of the module. Power, from a direct current source, is supplied to lead wires 46. The entire module is adapted to be mounted in a panel, or as otherwise required for a refrigeration device.

Figure 7:
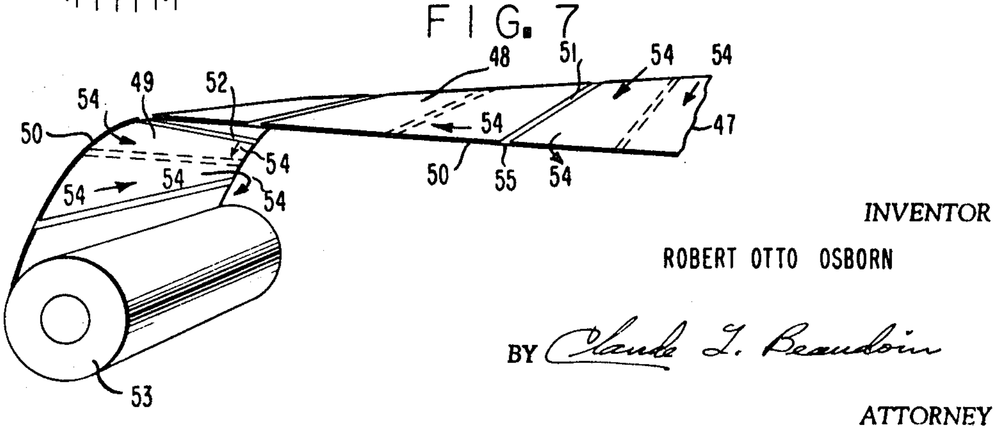
FIG. 7 is a perspective view of yet another embodiment of a thermoelectric device having unlike thermoelectric material on opposite surfaces of a flexible film structure of thermoplastic material.

Another embodiment of the thermoelectric device of the present invention is shown in FIG. 7. The thermoelectric device shown in FIG. 7 includes a flexible film support 47 of organic thermoplastic polymeric material having non-contacting bands 48 and 49 of unlike thermoelectric materials on the opposite surfaces thereof. The device of FIG. 6 additionally includes conductive strips 50 on the edges thereof that contact each of bands 48 and 49 that are in overlapping relationship, i.e., the transverse edges 51 and 52 are off-set. The conductive strip or bead 50 is adapted to provide a current path from one thermoelectric material to the other which are thus presented in series electrical connection. FIG. 6 shows in perspective a roll 53 of the flexible film thermoelectric device of the invention and illustratives the ease by which thermoelectric devices of different length may be fabricated by merely unrolling a different length of film material from the roll supply 53 thereof which may then easily have connected thereto any suitable electrical conductors for connecting the device to a utilization circuit. The current flow in the device of FIG. 6 is illustrated by the directional arrow 54. The electrical current in effect spirals around the flexible film support from one side to the other thereof and the separation bands 55 in effect force the flow of current from one side or edge to the other and the conductive strip or bead 50 on the edges effects transfer of the electrical current around the edges.

The device of the present invention may be made by depositing the thermoelectric materials on the flexible film support of polymeric material by evaporating the thermoelectric materials in a vacuum, spraying of the thermoelectric material dispersed in the manner of a pigment in a vehicle, or printing the bands of thermoelectric material employing a dispersion somewhat as is used in spraying. The method selected is dependent upon the composition of the thermoelectric material. For example, the single component thermoelectric materials, such as antimony, and bismuth, can readily be deposited by vacuum evaporation, but some of the more desirable materials such as the compounds of elements of the third, fourth, and fifth groups of the periodic system (e.g., bismuth teluride) require specially devised evaporation techniques. Accordingly, in cases where the foregoing require special techniques these can be sprayed in a dispersed form.

The significance of this invention and the lack of success of prior art thermoelectric devices which employ electrically non-conductive supports can be appreciated from a consideration of some of the parameters of a device capable of high performance. These parameters are important whether the device is used for power generation or as an application of the Peltier effect for refrigeration. Two major features for consideration are the thickness of the thermoelectric coating and conductive coupling strap materials with respect to the thickness of the support and the configuration or extent of coverage of conductive materials on the support.

In the present invention it has been found that conformity to certain limitations of these parameters is preferred if the advantages of film-supported thermopiles are to be fully realized. These advantages, in addition to the relative ease of fabrication of multi-junction devices, include mechanical flexibility, which enables shaping the device to conform to a most practical design. The requirement for flexibility puts definite limitations on the balance of efficiency determining parameters.

The dependence of efficiency on the parameters is illustrated in equations defining the coefficient of performance C, which is given by the ratio of the rate of heat removal (Q) to power input ($\dot{w}$);

$$C=\frac{\dot{Q}}{\dot{w}}$$

The inter-relationship of the parameters which determines these variables illustrates the difficulty in maximizing the coefficient of performance:

$$\dot{Q}=\frac{dQ}{dt}=IST^{\circ}-K\frac{\Delta T}{L}-\tfrac{1}{2}I^2R$$

and $$\dot{w}=\frac{dw}{dt}=I\left(\theta+I\rho\frac{L}{A}\right)$$

where

S=thermoelectric power in volts/° K.
I=electric current density in amperes
T°=cold junctions temperatures in ° K.
ΔT=temperature difference, hot and cold junctions in ° K.
K=thermal conductivity of film leg in watt-cm./° K.
L=length of thermoelectric leg in cm.
$\theta$=thermoelectric force in volts
$\rho$=electrical resistivity in ohm-cm.
A=cross-sectional area of leg in cm.$^2$
R=resistance, ohms Since changes of the magnitude of these parameters in a device will have a complicated effect on the performance, the preferred limits cannot readily be predicted. In accordance with the objectives, these parameters are effectively optimized by this invention in a manner consistent with other requirements such as mechanical requirements.

A major handicap in the use of non-electrical structural members on the legs of thermoelectric devices is the contribution of the non-electrical components to heat flow along the leg between the hot and cold junctions. This is apparent in the negative portion $$\frac{(K\Delta T)}{L}$$

of the equation defining the rate of heat removal by the cold junctions. This value of thermal conductivity is a gross effect, including the conductivity of both the electrically conductive portion of the leg and the film support. The thermal conductivity of plastic films is of the order of 3.0% to 50% that of semi-conductor materials, which are the preferred materials for thermoelectric elements, and approximately 0.1% of metals, such as copper. Accordingly, to minimize the "back flow" of heat, the ratio of the thickness of the support film to the thickness of the essential electrical conductors is kept as small as possible. The absolute magnitude of the thickness of the conductive coating on the film, and the minimum thickness of the film are limited however, by mechanical considerations. Thus, the film thickness has a maximum effective value determined, from thermal factors, by the thickness of the thermoelectric coating, and a minimum determined by the mechanical requirements, as discussed hereinafter. The thermoelectric coating, likewise, has a maximum effective thickness determined by mechanical considerations, as described hereinafter, and a minimum effective thickness determined by the thickness of the support film on the basis of thermal factors, thus establishing a mutual dependence of the thickness of the coating and support.

What is claimed is:

1. A thermoelectric device adapted for connection to a utilization circuit comprising a non-conductive support of a thin, flexible film structure of organic thermoplastic polymeric material, a thermoelectric material disposed on one surface of said film support, a second thermoelectric material having a thermoelectric power different from said first thermoelectric material disposed on the opposite surface of said film support in overlapping relationship to said first thermoelectric material, each of said thermoelectric materials being disposed on said film support in the form of a plurality of non-contacting bands, the ratio of the thickness of said thermoelectric materials to the thickness of said flexible film structure being between about 5:1 to 0.3:1, the maximum thickness of said thermoelectric materials being about 2 mils, a plurality of perforations through said support and located at opposite lateral edges of said support, and electrically conductive means disposed in said perforations and on the surface of said thermoelectric materials and extending between said perforations and the closest lateral edge of said support material thereby contacting opposite pairs of said thermoelectric materials so as to form a series of hot and cold junctions along opposite lateral edges of said support.

2. The thermoelectric device of claim 1 wherein said non-conductive support of a thin, flexible film structure of organic thermoplastic polymeric material is polyethylene terephthalate.

3. The thermoelectric device of claim 2 wherein said thermoelectric materials of unlike thermoelectric power comprise non-contacting bands of antimony on one surface of said support and non-contacting bands of bismuth on the other surface of said support.

4. A thermoelectric device adapted for connection to a source of direct current for heating or cooling comprising the thermoelectric device of claim 1 in convolute form.

References Cited

UNITED STATES PATENTS

| | | | |
|---|---|---|---|
| 2,519,785 | 8/1950 | Okolicsanyi | 136—212 |
| 2,694,098 | 11/1954 | Leins | 136—225 |
| 2,798,494 | 7/1957 | Sukacev | 136—225X |
| 2,984,077 | 5/1961 | Gaskill | 62—3 |
| 3,071,495 | 1/1963 | Hanlein | 117—212 |
| 3,090,206 | 5/1963 | Anders | 62—3 |
| 3,111,813 | 11/1963 | Blumentritt | 62—3 |
| 3,133,539 | 5/1964 | Eidus | 62—3X |
| 3,186,883 | 6/1965 | Frantzen | 156—7 |
| 3,272,659 | 9/1966 | Bassett, Jr., et al. | 136—203 |
| 3,284,245 | 11/1966 | Nottage et al. | 136—212 |
| 3,293,082 | 12/1966 | Browwer et al. | 136—212X |
| 3,305,393 | 2/1967 | Breckenridge | 136—225X |
| 3,392,061 | 7/1968 | Schreiner et al. | 136—203 |

FOREIGN PATENTS

| | | | |
|---|---|---|---|
| 910,733 | 11/1962 | Great Britain | 136—225 |
| 915,183 | 1/1963 | Great Britain | 136—225 |
| 748,757 | 4/1933 | France | 136—226 |
| 1,202,555 | 7/1959 | France | 136—224 |
| 1,359,464 | 3/1964 | France | 136—225 |

OTHER REFERENCES

Ioffe, A. F. "Semiconductor Elements and Thermoelectric Cooling," Infosearch Ltd. London, (QC274 Iope. Sci. Lib.) pp. title, 36 & 37.

JOHN H. MACK, Primary Examiner

A. BECKELMAN, Assistant Examiner

U.S. Cl. X.R.

29—573; 62—3; 117—212; 136—204, 225